(12) United States Patent
Christophersen et al.

(10) Patent No.: US 7,675,293 B2
(45) Date of Patent: Mar. 9, 2010

(54) METHOD AND APPARATUS FOR IN-SITU CHARACTERIZATION OF ENERGY STORAGE AND ENERGY CONVERSION DEVICES

(75) Inventors: Jon P. Christophersen, Idaho Falls, ID (US); Chester G. Motloch, Idaho Falls, ID (US); John L. Morrison, Butte, MT (US); Weston Albrecht, Layton, UT (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 951 days.

(21) Appl. No.: 11/381,689

(22) Filed: May 4, 2006

(65) Prior Publication Data

US 2007/0257681 A1 Nov. 8, 2007

(51) Int. Cl.
*G01R 29/26* (2006.01)
*G01N 27/416* (2006.01)
(52) U.S. Cl. ...................... 324/613; 324/430
(58) Field of Classification Search ................. 324/613, 324/430
See application file for complete search history.

(56) References Cited

U.S. PATENT DOCUMENTS

| | | | |
|---|---|---|---|
| 5,747,456 A * | 5/1998 | Chorev et al. ................. | 514/12 |
| 5,773,978 A | 6/1998 | Becker | |
| 6,002,238 A | 12/1999 | Champlin | |
| 6,307,378 B1 | 10/2001 | Kozlowski | |
| 6,340,889 B1 * | 1/2002 | Sakurai ...................... | 324/433 |
| 6,359,419 B1 | 3/2002 | Verbrugge et al. | |
| 6,417,669 B1 | 7/2002 | Champlin | |
| 6,639,385 B2 | 10/2003 | Verbrugge et al. | |
| 6,653,817 B2 | 11/2003 | Tate, Jr. et al. | |
| 6,693,439 B1 * | 2/2004 | Liu et al. .................... | 324/613 |
| 2001/0035756 A1 | 11/2001 | Kozlowski | |
| 2006/0186890 A1 * | 8/2006 | Iwane et al. ................ | 324/426 |

OTHER PUBLICATIONS

Baert et al., "Determination of the State-of-Health of VRLA Batteries by Means of Noise Measurements," Intelec 2001, Oct. 14-18, 2001, Conference Publication No. 484, pp. 301-306.

Hoffmann et al., "Development and Test A of Real Time Battery Impedance Estimation System," IEEE 0-7803-9546-8/06, 2006, pp. 1-8.

(Continued)

*Primary Examiner*—Jeff Natalini
(74) *Attorney, Agent, or Firm*—TraskBritt

(57) ABSTRACT

Disclosed are methods and apparatuses for determining an impedance of an energy-output device using a random noise stimulus applied to the energy-output device. A random noise signal is generated and converted to a random noise stimulus as a current source correlated to the random noise signal. A bias-reduced response of the energy-output device to the random noise stimulus is generated by comparing a voltage at the energy-output device terminal to an average voltage signal. The random noise stimulus and bias-reduced response may be periodically sampled to generate a time-varying current stimulus and a time-varying voltage response, which may be correlated to generate an autocorrelated stimulus, an autocorrelated response, and a cross-correlated response. Finally, the autocorrelated stimulus, the autocorrelated response, and the cross-correlated response may be combined to determine at least one of impedance amplitude, impedance phase, and complex impedance.

30 Claims, 9 Drawing Sheets

OTHER PUBLICATIONS

Kozlowski, James D., "A Novel Online Measurement Technique for AC Impedance of Batteries and Other Electrochemical Systems," IEEE, 0-7803-6545-3/01, 2001, pp. 257-262.

Robinson, R.S., "System Noise as a Signal Source for Impedance Measurements on Battery Strings," S.36.B Batteries, date unknown, pp. 365-368.

* cited by examiner

METHOD AND APPARATUS FOR IN-SITU CHARACTERIZATION OF ENERGY STORAGE AND ENERGY CONVERSION DEVICES

GOVERNMENT RIGHTS

This invention was made with government support under Contract No. DE-AC07-05ID14517 awarded by the United States Department of Energy. The government has certain rights in the invention

BACKGROUND OF THE INVENTION

1. Field of the Invention

The present invention relates generally to determining energy-output device parameters and, more specifically, to determining energy-output device impedance.

2. State of the Art

A battery converts stored chemical energy to electrical energy, which may be conveyed as a voltage source. As with any non-ideal voltage source, the battery will have an internal impedance including a combination of resistance and reactance. The internal impedance produces power loss in a system by consuming power as a voltage drop across the source impedance. Ideally, a perfect battery would have no source impedance and deliver any power to the extent of its stored energy, but this is not physically reasonable. Thus, within physical limits, a reduction in source impedance will increase deliverable power.

As a battery ages the internal impedance generally tends to become larger. A brand new battery will have a Beginning Of Life (BOL) impedance much smaller than the End Of Life (EOL) impedance. Similarly, storage capacity of the battery will decrease from BOL to EOL. Therefore, observations of battery parameters such as internal impedance and storage capacity may be used to determine the overall State Of Health (SOH) of a battery. When the internal impedance becomes too large and the battery capacity can no longer reliably deliver energy at the specified power the battery has effectively reached EOL. Furthermore, the rate of change of a battery's internal impedance may be closely related to the state of health of the battery. This is especially true when considering rechargeable or secondary cells. While different secondary battery chemistries undoubtedly perform differently throughout their lives, increases in internal impedance over life at certain frequencies show promise as a uniform method to classify SOH in most chemistries.

Battery impedance also may vary with the relative charge of the battery and temperature. In other words, a battery at half of its rated capacity will have different impedance than a battery at its full rated capacity. Similarly, a battery at different temperatures will exhibit different internal impedance characteristics.

Battery fuel gauges, battery capacity monitors, and battery status monitors attempt to predict battery capacities and give the user an idea of remaining capacity. Conventionally, battery capacity is estimated by current integration, voltage monitoring, or combinations thereof.

Current integration, or coulomb counting as it is commonly called, monitors the battery's available stored charge by measuring the amount of charge that enters and exits the battery through normal cycling. The basis for this approach is, that if all charge and discharge currents are known, the amount of coulometric capacity will be known.

Voltage monitoring methods are based on the recognized relationship between the battery terminal voltage and the remaining capacity. All that is required is voltage measurement of the battery terminals to acquire a rough idea of the State Of Charge (SOC) of the battery.

Both of these methods have limits when applied to actual conditions. Current integration requires a rigorous amount of external current tracking to remain accurate. SOC determination obtained from measurement and integration of external current suffers from errors caused by internal self-discharge currents. If the battery is not used for several days, this self-discharge current dissipates the charge within the battery and can affect the current integration approximation for battery charge.

Voltage monitoring may show errors when measurements are taken with load on the battery. When a load is applied, the voltage drop due to the internal impedance of the battery distorts battery voltage. For many batteries, such as lithium-ion batteries, even after the load is removed, slow time constants and relaxation processes may continue to change the battery voltage for hours. Also, some battery chemistries (e.g., nickel metal-hydride) exhibit a strong voltaic hysteresis, which hinders the possibility of using voltage to track capacity.

Usually, these two methods are combined to operate together under varying conditions. For example, current integration may monitor the SOC while under discharging and charging currents. Whereas, while the battery is at rest voltage monitoring may be employed to monitor self-discharge.

SOC algorithms and measurement techniques are well known, but methods to predict battery life, or state of health (SOH), are less common. As mentioned earlier, SOH is also very dependent on cell impedance. If the cell impedance dependencies on SOC and temperature are known, or closely approximated, it is possible to employ modeling techniques to determine when a discharged voltage threshold will be reached at the currently observed load and temperature. Cell impedance analysis for SOH may be enhanced even more if the battery impedance estimation process were fast enough to eliminate the impedance dependencies on comparatively slow changes like SOC variations and temperature variations. Therefore, a way to monitor battery impedance in-situ at near real time would greatly enhance SOC and SOH predictions due to aging cells.

Conventionally, Electrochemical Impedance Spectroscopy (EIS) is a popular method for analyzing battery impedance. EIS generates a sine excitation waveform at a specific frequency that is applied to the battery. The voltage and current responses are monitored and analyzed to arrive at battery impedance for that particular frequency. Then, the frequency of the sine excitation signal is modified over a range of frequencies to arrive at a frequency spectrum of the battery impedance. This process provides stable, accurate measurements of battery impedance, but is most practical for laboratory conditions, not during in-situ operation. In other words, EIS may not work well when the battery is under changing loads as changes imposed upon the sine wave excitation may skew the results. Also, the methodology of the EIS system is inherently serial (i.e., a single frequency for each step), making its application time consuming (often several hours) and inappropriate for a near real-time analysis.

Therefore, to enhance monitoring of life and in-situ charge of a battery or other energy-output device under normal conditions, there is a need for a method and apparatus for determining energy-output device impedance across a frequency spectrum using near real-time measurement and analysis that may be employed during in-situ operation.

BRIEF SUMMARY OF THE INVENTION

The present invention provides methods and apparatuses for determining impedance of an energy-output device across a frequency spectrum using near real-time measurement and analysis that may be employed during in-situ operation.

An embodiment of the present invention comprises an apparatus for characterizing an energy-output device, which includes a random noise generator, a current generator, a current measurement device, a bias reducer, and an analyzer. The current generator develops a random noise stimulus based on a random noise signal from the random noise generator, and is configured for operable coupling to an energy-output device terminal. The current measurement device, which is operably coupled to the random noise stimulus, is configured for measuring the random noise stimulus to determine a measured noise stimulus. The bias reducer, which is operably coupled to the random noise stimulus and an average voltage signal, is configured for generating a bias-reduced response. Lastly, the analyzer, which is operably coupled to the measured noise stimulus and the bias-reduced response, is configured for correlating the measured noise stimulus and the bias-reduced response to determine an impedance of the energy-output device.

Another embodiment of the present invention comprises a method of determining an impedance of an energy-output device. The method includes generating a random noise signal and generating a random noise stimulus as a current source correlated to the random noise signal. The method further includes applying the random noise stimulus to an energy-output device terminal of the energy-output device and measuring the random noise stimulus as a measured noise stimulus. The method further includes generating a bias-reduced response by comparing a voltage at the energy-output device terminal to an average voltage signal and correlating the measured noise stimulus and the bias-reduced response to determine the impedance of the energy-output device.

Another embodiment of the present invention comprises a method of determining an impedance of an energy-output device using a random noise stimulus applied to the energy-output device. The method includes periodically sampling the random noise stimulus to generate a time-varying current stimulus and periodically sampling a voltage response of the energy-output device to the random noise stimulus to generate a time-varying voltage response. The method further includes autocorrelating the time-varying current stimulus to generate an autocorrelated stimulus, autocorrelating the time-varying voltage response to generate an autocorrelated response, and cross-correlating the time-varying current stimulus and the time-varying voltage response to generate a cross-correlated response. Finally, the method includes combining the autocorrelated stimulus, the autocorrelated response, and the cross-correlated response to determine at least one of an impedance amplitude, an impedance phase, and a complex impedance.

BRIEF DESCRIPTION OF THE DRAWINGS

In the drawings, which illustrate what is currently considered to be the best mode for carrying out the invention.

DETAILED DESCRIPTION OF THE INVENTION

Figure 1:
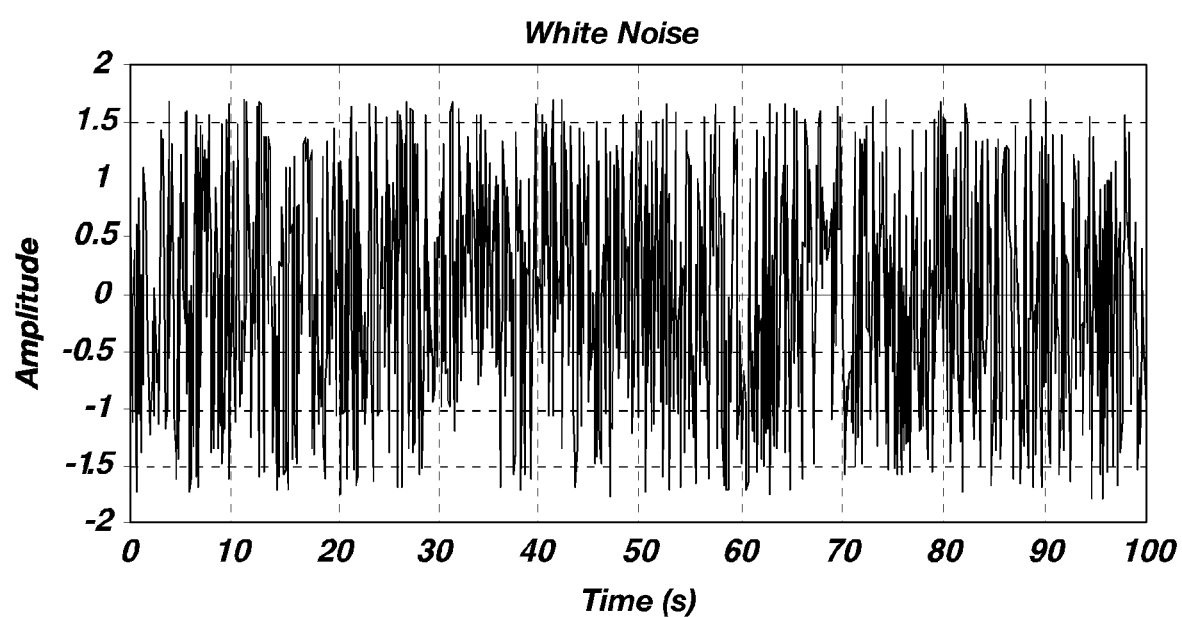
FIG. 1 is a graph of a representative white noise signal.

The present invention provides methods and apparatuses for determining impedance of an energy-output device across a frequency spectrum using near real-time measurement and analysis that may be employed during in-situ operation.

In the following description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

In this description, some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

In this description, embodiments of the present invention may be used to characterize a wide variety of energy storage and energy conversion devices. For example, and not limitation, energy conversion devices may include fuel cells, solar cells, and the like. Also for example, and not limitation, energy storage devices may include batteries, ultracapacitors, and the like. These energy conversion devices and energy storage devices may be referred to herein generically as "energy-output devices." References and example embodiments using batteries will be understood by those of ordinary skill to be equally applicable to all energy-output devices.

The present invention includes using random signal techniques, signal generation, data acquisition, and signal processing to determine the complex impedance of an energy-output device. In general, the complex impedance of an energy-output device may be non-linear. However, by using small signal techniques, the non-linearity of an energy-output device's impedance curve may be modeled as a piecewise linear approximation. In other words, small signal excitations and responses may be used to confine the process to a pseudo-linear segment of the cell's current versus voltage impedance curve.

As stated earlier, conventional EIS battery characterization techniques apply sine wave excitation to a battery at a variety of different frequencies, wherein each frequency is applied to the battery serially. The present invention uses a broad spectrum noise signal to essentially apply a wide variety of frequencies to the battery simultaneously, then uses random signal techniques and signal processing to determine the battery's impedance characteristics over that broad spectrum.

The term "noise" normally pertains to unwanted signal content seen on a wanted signal of interest. For the purposes of the present invention, the term "noise" is used as a desired signal to be applied to a system. As a general definition, noise is a truly random signal that is unpredictable and shows no repetition. "White noise" is a term that is often used to define a random signal including all frequencies.

Of course, in practical applications, white noise would need to be infinite in duration to truly encompass infinite bandwidth. A band-limited white noise signal, or colored signal, contains only a range of frequencies that are of interest. In this report, the colored noise generated was a variation of pink noise, which is a stationary Gaussian white noise that eliminates high frequencies. The present invention, therefore, employs a band-limited white noise, referred to as "pink noise," which is stationary Gaussian white noise, with a substantially constant signal power spectral density across the frequency band of interest. Modifying the frequency band of the pink noise may be useful for determining different energy-output device characteristics and different energy-output device chemistries.

Applying random signals to a system generates a need for the application of random process functions involving correlation and Fourier transforms to determine the resultant frequency response of the system. Additionally, the process is substantially stationary such that the random signal statistical properties of mean and variance are held constant. A brief explanation of well-known random signal processes will give a background for understanding the present invention.

Correlation functions are time averaging processes that generally provide an indication of how well two signals relate to each other. If the correlation is zero, then the signals are statistically unrelated. The correlation function of equation 1 illustrates the randomness of a signal.

$$R_{xy}(\tau) = \lim_{T \to \infty} \frac{1}{T} \int_0^T x(t) y(t + \tau) dt \tag{1}$$

where:
x is one signal as a function of time;
y is another signal as a function of time;
t is time, in seconds;
T is the length of signal time records, in seconds;
$\tau$ is a time shift between the signals, in seconds; and
$R_{xy}$ is the cross-correlation as a function of time shift $\tau$.

In the discrete world, which is more useful for digital signal processing, the correlation function may be defined by equation 2.

$$R_{xy}(m) = \frac{1}{N - |m|} \sum_{n=0}^{N-|m|-1} x(n) y(n + m), \quad 0 \leq m \leq N - 1 \tag{2}$$

where:
x is one signal as a function of discrete time;
y is another signal as a function of discrete time;
n is a discrete time interval;
N is the length of the discrete signal time record;
m is a discrete time shift; and
$R_{xy}$ is the discrete cross-correlation function of time shift m.

For example, a finite random time record that is correlated with itself via equation 2, termed autocorrelation, should show little or no correlation except when the signal is compared directly at $\tau=0$ where the signal lines up with itself perfectly.

For system identification, an input signal may be configured to excite a linear system and produces an output based on the parameters of the linear system. Looking at the correlation time shift profiles between the input and output information can yield a frequency response function for the linear system.

For many systems, the frequency domain is more useful for analyzing the behavior of the system. A correlated signal may be converted from the time domain to the frequency domain using a process such as a Fourier transform. Furthermore, according to basic random signal theory, a power spectral density (PSD) can be defined as the Fourier transform of the correlation function pairs when dealing with a stationary random signal process. Equation 3 defines shows that the autocorrelation function and PSD of the output are Fourier transform pairs.

$$R_{yy}(\tau) = \Im^{-1}[S_{yy}(f)] = \int_{-\infty}^{\infty} S_{yy}(f) e^{j2\pi f \tau} df \tag{3}$$

where:
$R_{yy}$ is the continuous cross-correlation, typically in Watts;
$S_{yy}$ is the continuous power spectral, in Watts/Hertz;
$\Im^{-1}$ is the Fourier transform operation;
f is frequency, in Hertz; and
$\tau$ is a time shift, in seconds.

The discrete representation of the inverse Fourier transform of equation 3 is defined in equation 4.

$$R_{yy}(n) = \Im^{-1}[S_{yy}(k)] = \frac{1}{N} \sum_{k=0}^{N-1} S_{yy}(k) e^{j(2\pi/N)kn} \tag{4}$$

where:
$R_{yy}$ is the discrete cross-correlation, typically in Joules/step;
$S_{yy}$ is the discrete power spectral density, in Joules/step;
$\Im^{-1}$ is the inverse Fourier transform operation;
k is the unitless discrete frequency;
N is the unitless length of the discrete frequency record; and
n is a unitless discrete time shift.

This random signal theory and conversion to the frequency domain can be useful in relating the input and output of a random process. For example, the PSD of the output equals the PSD of the input multiplied by the square of the magnitude of the system transfer function. Thus the magnitude (which may also be referred to as the amplitude) of the system transfer function may be calculated using equation 5.

$$S_{yy}(f)=|H(f)|^2 S_{xx}(f) \quad (5)$$

where:
$S_{xx}$ is the auto-spectral density of the input, in Watts/Hz;
$S_{yy}$ is the auto-spectral density of the output, in Watts/Hz; and
H(f) is the system transfer function, typically unitless.

Another relationship involves cross-correlation of the input and output and subsequent PSD transformation to obtain the system transfer function. When this cross-spectral relationship is used, the phase of the system transfer function may be calculated using equation 6.

$$S_{xy}(f)=H(f)S_{xx}(f) \quad (6)$$

where:
$S_{xx}$ is the auto-spectral density of the input, in Watts/Hz;
$S_{xy}$ is the cross-spectral density function, in Watts/Hz; and
H(f) is the system transfer function, typically unitless.

Very simply put, the power spectral densities of the input and output random signals define the system transfer function of a linear stationary process and vice versa. Furthermore, if the transfer function represents an energy-output device, by determining amplitude and phase for the transfer function, the impedance characteristics across a frequency spectrum of interest may be determined. The impedance characteristics may be visualized as well-known Bode plots (may also be referred to as frequency plots) and Nyquist plots to illustrate the resistance (real portion of impedance) and the reactance (imaginary portion of impedance) of the impedance of an energy-output device across the frequency spectrum. The various plots and their interpretation are explained more fully below.

In visualizing random noise, correlation functions, and PSD, it may be useful to first examine a random noise signal. FIG. 1 illustrates a representative white noise signal with zero mean and unity variance shown in the time domain across a period of about 100 seconds.

A defining property of white noise with zero mean and unity variance is that its PSD is a flat line of magnitude one over all frequencies. In order to be truly white, the acquired time signal would need to extend to an infinite time record. If the signal was infinitely long and truly random, then the autocorrelation of the signal via equation 1 or 2 would be a perfect impulse function with a single peak of magnitude one at τ=0 and magnitude zero everywhere else. This impulse function is illustrated in FIG. 2A for a pink noise signal including a broad frequency spectrum, which shows 3,000 averaged autocorrelations of the random time signal of FIG. 1.

Figure 2A:
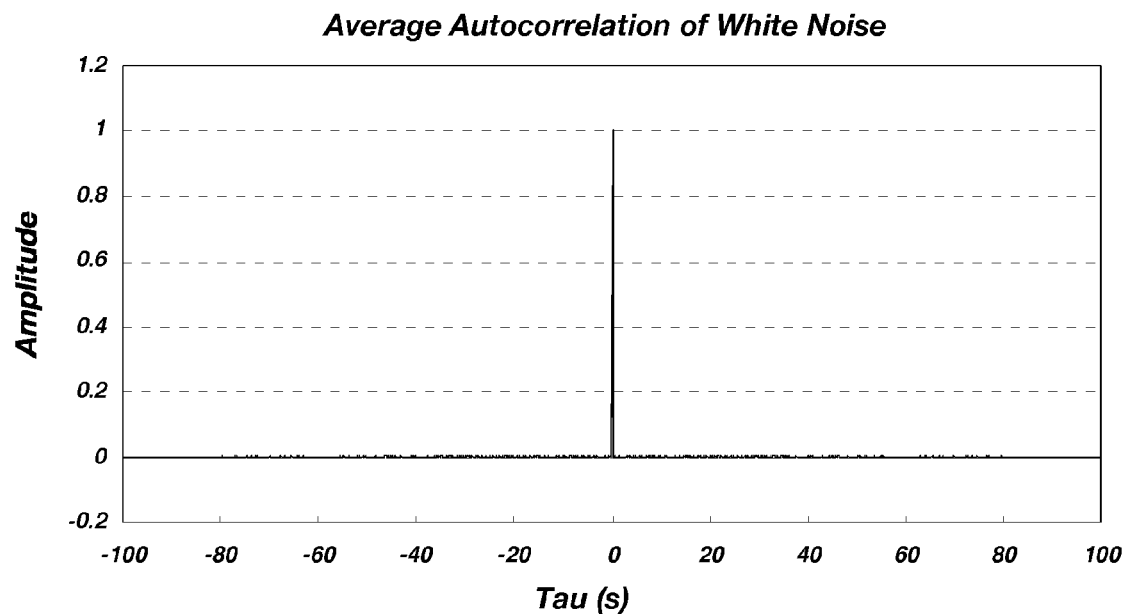
FIG. 2A is a graph of an average autocorrelation of the white noise signal of FIG. 1.
Figure 2B:
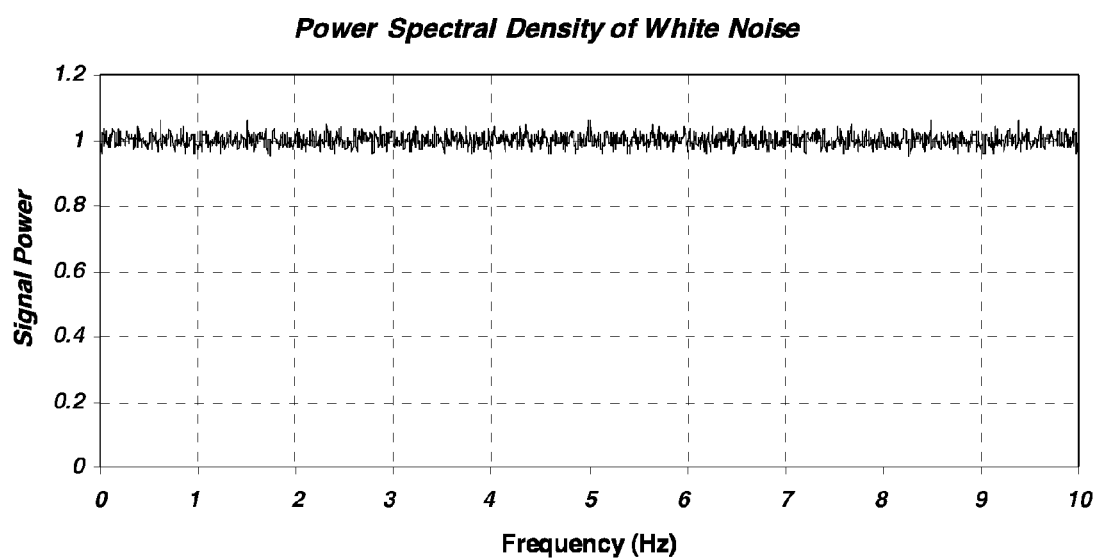
FIG. 2B is a graph of a power spectral density of the white noise signal of FIG. 1.

FIG. 2B illustrates the PSD of the pink noise derived from the autocorrelation of FIG. 2A converted to the frequency domain by a Fourier transform. Since the averages of the white noise autocorrelation gives an impulse, the Fourier transform of the autocorrelation to obtain the PSD illustrates a substantially flat PSD. However, since the autocorrelation function of FIG. 2A includes some variance due to a finite number of averages, the PSD of FIG. 2B also exhibits small variances.

Figure 3:
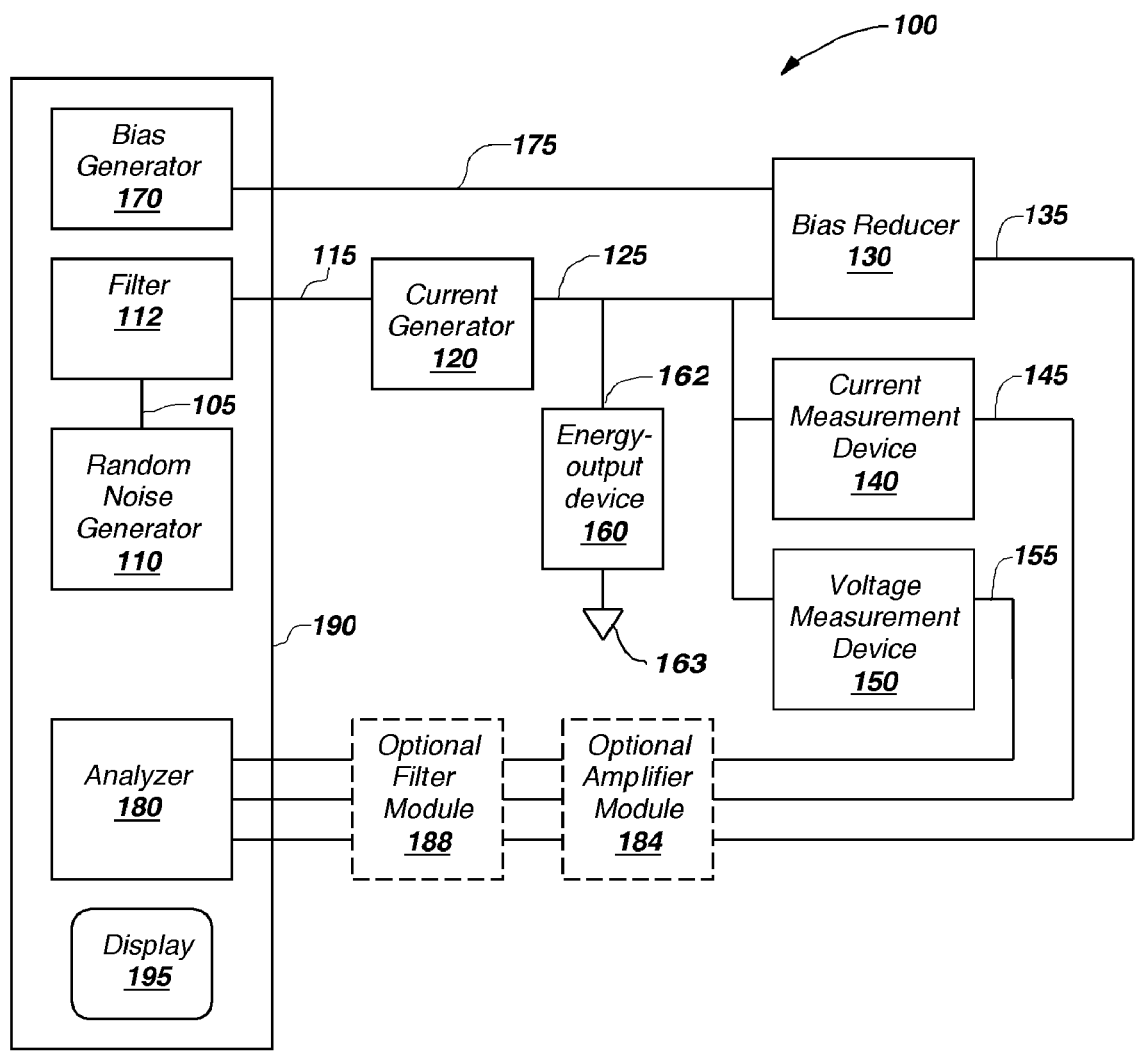
FIG. 3 is a block diagram of a representative embodiment of the present invention.

FIG. 3 illustrates an apparatus 100 for characterizing an energy-output device according to the present invention. The apparatus 100 includes a random noise generator 110, which may also include a filter 112 for smoothing and modifying the random noise signal 115. The random noise signal 115 is a time varying voltage signal. For application to an energy-output device 160, a current generator 120 converts the random noise signal 115 to a random noise stimulus 125, which is a current source suitable for application to an energy-output device terminal 162 in which one terminal of the energy-output device 160 is connected to the random noise stimulus 125 and the other terminal is coupled to a ground 163. A bias generator 170 generates an average voltage signal 175, which approximates the present voltage on the energy-output device 160. A bias reducer 130 compares the voltage at the energy-output device 160 to the average voltage signal 175 to obtain a difference between the two signals, which represents the bias reduced response to the random noise stimulus 125. In addition, a voltage measurement device 150 may be coupled to the energy-output device terminal 162 to determine the energy-output device voltage and generate an energy-output device voltage signal 155.

In some systems according to the present invention, the bias generator 170, random noise generator 110, filter 112, and an analyzer 180 may be discrete elements targeted at their specific function. However, in other systems according to the present invention, these functions may be included in a computing system 190. Thus, the computing system 190 may include software for performing the functions of random (or pseudo-random) noise generation, digital filtering, averaging the time-varying voltage signal to generate the average voltage signal 175, and analyzing the input signals (135, 145, and 155) to determine impedance of the energy-output device 160. In addition, the computing system 190 may include a display 195 for presenting data in a format useful for interpreting impedance characteristics of the energy-output device 160, as is explained more fully below. The display 195 may also be used for presenting more general battery characteristics of interest, such as, for example, SOH or SOC.

The random noise generator 110 may be any suitable apparatus for generating a random noise signal 115 with an average voltage substantially near zero. By way of example, and not limitation, the random noise generator 110 may be a digital signal generator (not shown) configured to generate a digital representation of random noise or pseudo-random noise as a substantially random digital signal. The digital signal generator may be configured as digital logic or as computer instructions for execution on the computing system 190. The filter 112 may be a bandpass filter used for smoothing a digital random noise signal 105 by removing high frequencies and low frequencies to present an analog signal more suitable for application to the energy-output device 160. The filter 112 may include a digital filter configured as digital logic or as computer instruction for execution on the computing system 190. The filter 112 also may include an analog filter configured as analog elements. Finally, the filter 112 may include a digital filter and an analog filter in combination.

For example, a digital smoothing filter may bandwidth limit the random noise signal 115 and smooth transitions between the random data points. The digitally filtered random noise may then be filtered with analog elements to limit the bandwidth to be less than the Nyquist frequency of the analyzer 180.

The random noise stimulus 125 may be applied to the energy-output device terminal 162 in-situ during normal operation or possibly during other testing operations. For this in-situ application, the random noise stimulus 125 should keep the energy-output device 160 charge neutral. In other words, the random noise stimulus 125 should have an average current substantially near zero. Therefore, the current generator 120 is configured to be voltage controlled, while keeping the energy-output device 160 charge neutral relative to the absence of the random noise stimulus 125, and be transparent to the rest of the energy-output device system when not in use.

The actual current at the energy-output device 160 as a result of the random noise stimulus 125 is determined by a current measurement device 140 coupled to the random noise stimulus 125 and configured to generate a measured noise stimulus 145.

As mentioned earlier, for measuring the response of the energy-output device 160 to the random noise stimulus 125, the bias reducer 130 is coupled to the random noise stimulus 125 and configured to generate a bias-reduced response 135. Since the energy-output device 160 holds a charge while impedance data is gathered, a large bias voltage is constantly present within all the voltage measurements. Thus, measuring the large voltage of the energy-output device 160 may require a large dynamic range on the order of many volts, whereas measuring the voltage response to the random noise stimulus 125 may require sampling small changes on the order of micro-volts. A measurement system having the dynamic range necessary to measure the DC offset of the energy-output device 160 may not have the precision to measure the small variations in the voltage response.

Thus, the bias reducer 130 effectively subtracts the DC voltage offset, represented by the average voltage signal 175, from the voltage at the energy-output device terminal 162 leaving the bias-reduced response 135, which substantially represents only the energy-output device's response to the random noise stimulus 125.

The bias-reduced response 135, the measured noise stimulus 145, and the energy-output device voltage signal 155 may be operably coupled to an analyzer 180. The analyzer 180 is configured for periodically sampling the analog input signals (135, 145, and 155) and converting them to digital data to create records of a time-varying current stimulus, a time-varying voltage response, and a time-varying energy-output device voltage. The time-varying current stimulus and the time varying voltage response may be used by the analyzer 180 for determining impedance characteristics of the energy-output device 160, as is discussed more fully below with respect to FIG. 6. The time-varying voltage signal may also be used by the bias generator 170 for creating the average voltage signal 175.

The input signals (135, 145, and 155) may include a relatively small voltage range. Thus to condition the input signals (135, 145, and 155) for sampling by the analyzer 180, it may be desirable to amplify the input signals (135, 145, and 155) with an optional amplifier module 184. Furthermore, it may be desirable to filter the input signals (135, 145, and 155) with an optional filter module 188. Filtering may be useful to remove noise (e.g., unwanted instrumentation noise, as opposed to the desired random noise stimulus 125). Filtering also may be useful for anti-aliasing to remove high frequencies above the Nyquist frequency relative to the sampling rate of the analyzer 180.

Figure 4:
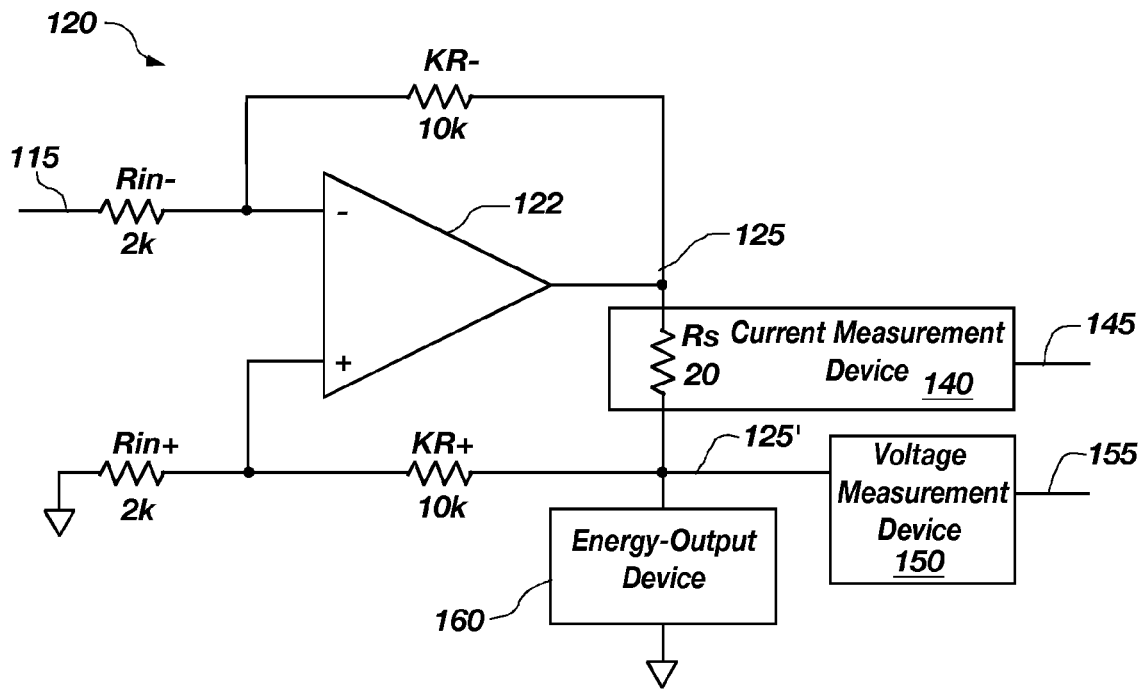
FIG. 4 is a schematic diagram of representative embodiment of a current generator and current measurement device combination, an energy-output device, and a voltage measurement device.

FIG. 4 is a schematic diagram of representative embodiment of a current generator 120 and a current measurement device 140 in combination. Also shown in FIG. 4 are the energy-output device 160, and the voltage measurement device 150. Current measurement may easily be determined by the voltage drop across a known resistance value. The current may then be calculated using Ohm's law. In some embodiments, the known resistor may be easily integrated in as part of the current generator 120. Thus FIG. 4 illustrates the current generator 120 and current measurement device 140 integrated together. The current generator 120 includes an operational amplifier 122 with the inverting input coupled to the random noise signal 115 through an input resistor Rin−. The non-inverting input is coupled to ground through resistor Rin+. Feedback for the inverting side of the operational amplifier 122 includes feedback resistor KR− coupled between the output of the operational amplifier 122 and the inverting input. Feedback for the non-inverting side of the operational amplifier 122 includes feedback resistor KR+ in series with the sense resistor Rs and coupled between the output of the operational amplifier 122 and the non-inverting input. The node between the sense resistor Rs and feedback resistor KR+ becomes the random noise stimulus 125 while the current of the random noise stimulus 125 may be measured as the voltage drop across the sense resistor Rs. As a result, the signal applied to the energy-output device 160 is a slightly modified random noise stimulus 125' in that it includes a small voltage drop due to the sense resistor Rs. Also shown is the voltage measurement device 150, which measures the voltage difference between ground and the terminal of the energy-output device 160.

The random noise stimulus 125 generated by the current generator 120 of FIG. 4 may be approximated by equation 7.

$$I_{out} = \frac{KR}{R_s \times R_{in}} V_{in} \tag{7}$$

Of course, equation 7 is an approximation that assumes that the current fed back through the KR+ resistor is negligible since the resistor will be thousands of times greater than the energy-output device impedance.

To accurately capture minor changes in impedance around the low level of 5 mΩ, characteristic of many batteries, an impedance resolution significantly lower than 5 mΩ may be beneficial. Thus, an impedance resolution orders of magnitude smaller is desirable. For example only, and not limitation, a value 1000 times smaller (i.e., 0.005 mΩ) may be useful as a desired impedance resolution for adequate impedance analysis of some batteries. With this small impedance resolution, the random noise stimulus 125 should include a current excitation high enough to obtain a consistently readable voltage drop across the sense resistor Rs. However, this current excitation should be held as low as feasible to prevent unnecessary charge and discharge cycling of the energy-output device 160.

Figure 5:
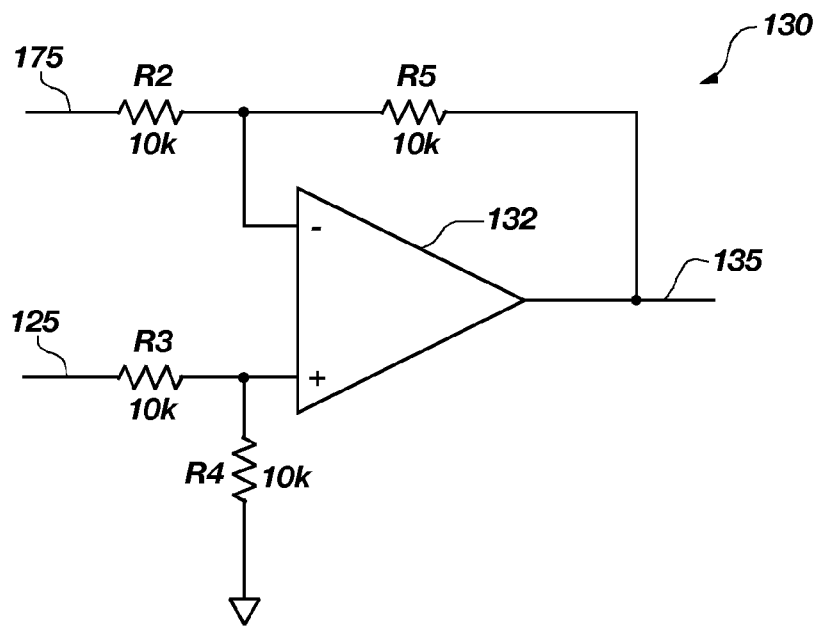
FIG. 5 is a schematic diagram of a representative embodiment of a bias reducer.

FIG. 5 is a schematic diagram of a representative embodiment of a bias reducer 130. The bias reducer 130 includes a non-inverting input coupled to the random noise stimulus 125 through a resistor combination of R3 and R4. The inverting input is coupled to the average voltage signal 175 through resistor R2, and a feedback resistor is coupled between a differential amplifier 132 output and the inverting input. The bias reducer 130 subtracts the average voltage signal 175 from the voltage at the energy-output device terminal 162 to obtain a bias-reduced response 135 with only the noise response portion of the energy-output device voltage. As a result of the bias reduction, the bias-reduced response 135 no longer includes a DC offset and may be easily amplified by the optional amplifier module 184 (shown in FIG. 3).

Figure 6:
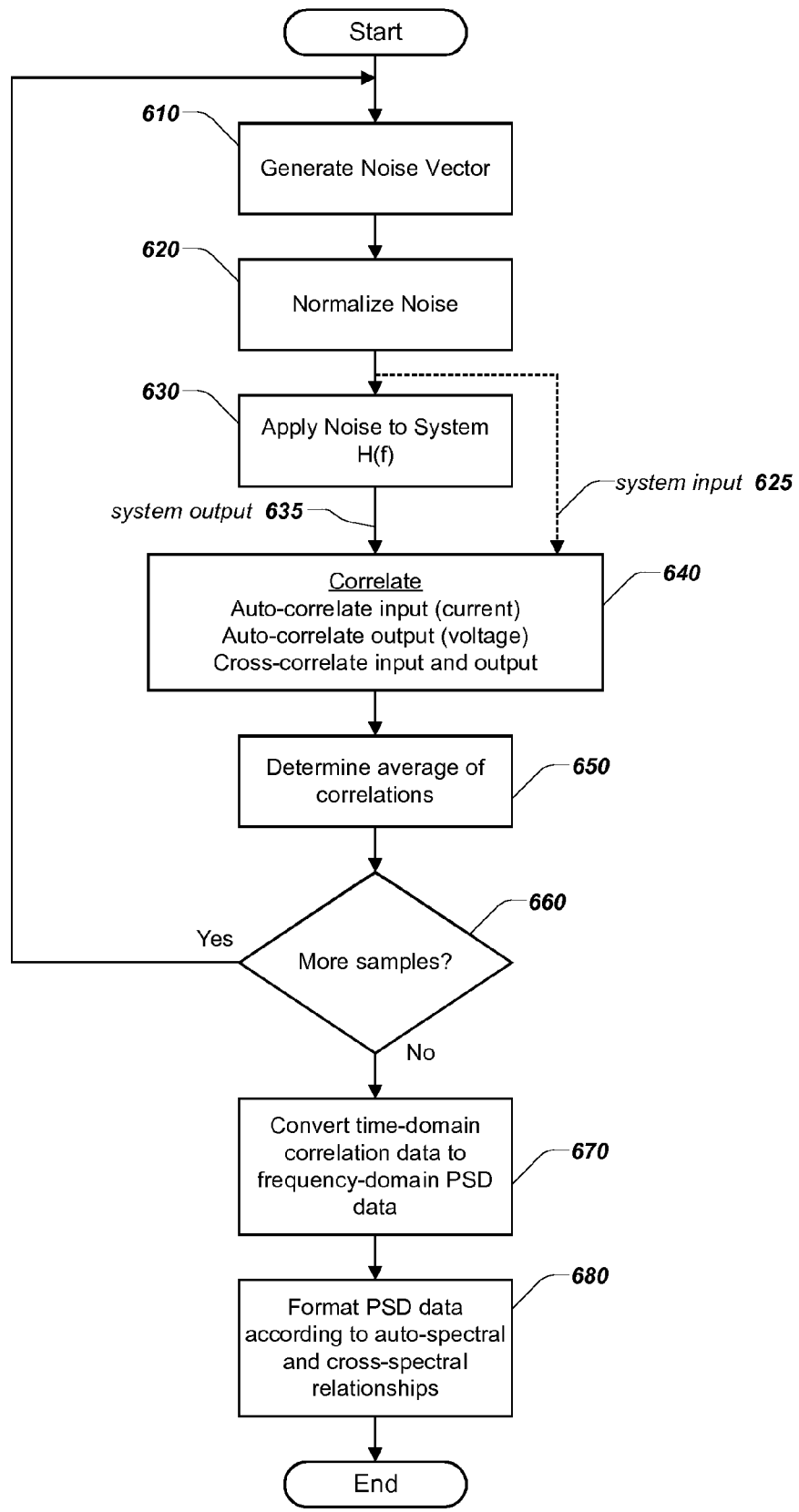
FIG. 6 is a flow chart of a representative process for determining the impedance of an energy-output device.

FIG. 6 is a flow chart of a representative process for determining the impedance of an energy-output device. In operation, and referring to FIG. 4 and FIG. 6, according to operation block 610, a random noise vector is created by the random noise generator. The random noise vector is normalized in operation block 620, to ensure that the average of the random noise signal will be substantially near zero so that the random noise stimulus to the energy-output device has a net current substantially near zero. The random noise stimulus is applied to the energy-output device in operation block 630. Direction line 625 does not represent a process transition as is typical in flow charts. Rather, direction line 625 is used to indicate that the measured noise stimulus is presented to the correlation function in operation block 640 along with the bias-reduced response (illustrated in FIG. 6 as system output 635).

Operation block 640 performs the correlation functions on the measured noise stimulus 145 and the bias-reduced response 135. An autocorrelation, according to equation 2 is performed on the measured noise stimulus 145, and the bias-reduced response 135. In addition, a cross-correlation between the measured noise stimulus 145 and the bias-reduced response is performed according to equation 2.

Operation block 650 averages the presently calculated correlations with an average of the correlations, wherein the average is calculated as a running average of the correlation for each time through the loop between decision block 660 and operation block 610. Thus, for the measured noise stimulus a new average is computed based on the current autocorrelation and the average from the previous times through the loop. Similarly, for the bias-reduced response a new average is computed based on the current autocorrelation and the average from the previous times through the loop. Finally, for the cross-correlation a new average is computed based on the current cross-correlation and the average cross-correlation from the previous times through the loop. As a result, the averaging of operation block 650 is repeated until an acceptably accurate representation of the correlation average is reached.

Decision block 660 tests to see if more samples are desired. If so, control transitions to operation block 610 to process a new set of samples. If no more samples are desired, control transfers to operation block 670. Gathering multiple sets of samples may be desirable to generate a more accurate history of the energy-output device's response to a limited length noise vector. A longer noise vector may more accurately represent purely random noise, and can represent a larger spectrum of bandwidths. However, for some random noise generators, a smaller length noise vector may be more desirable. Thus, it may be useful to run multiple sets of random noise vectors.

Operation block 670 uses the averaged values for the autocorrelation of the measured noise stimulus, the autocorrelation of the bias-reduced response, and the cross-correlation and converts them from the time domain to the frequency domain to generate the PSD for each using a Fourier transform based on equation 4.

Finally, operation block 680 uses the various PSD results to calculate transfer functions that represent the energy-output device's frequency response to the random noise stimulus according to equations 5 and 6. The final frequency response may be represented and visualized a data graphs for complex impedance, impedance amplitude, and impedance phase response.

Figure 7:
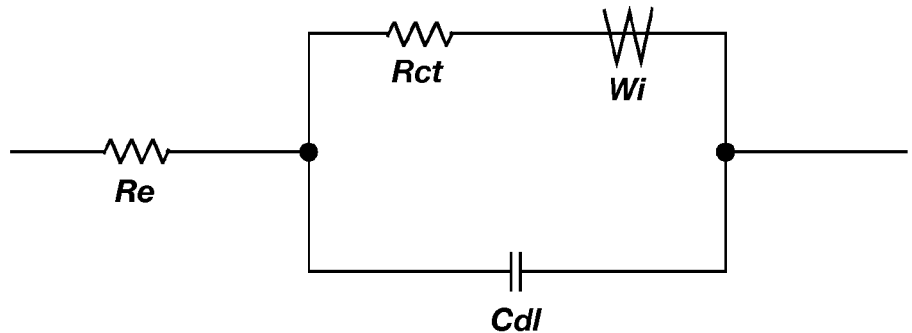
FIG. 7 is a schematic diagram of an ideal battery model.
Figure 8:
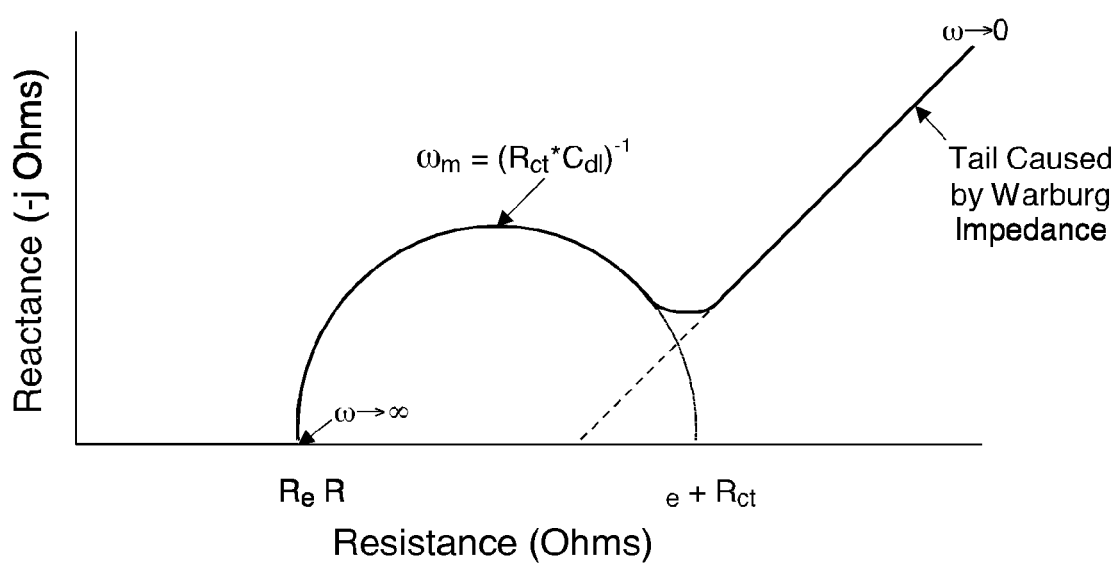
FIG. 8 is a Nyquist plot of the ideal battery model of FIG. 7.

As mentioned earlier, references and example embodiments using batteries will be understood by those of ordinary skill to be equally applicable to other energy-output devices. FIG. 7 is a schematic diagram of an ideal battery model and FIG. 8 is a Nyquist plot of the ideal battery model of FIG. 7. These figures are used to illustrate general battery characteristics and were taken from Linden, D. and T. B. Reddy, *The Handbook of Batteries*, New York: McGraw-Hill Co., 2002. In order to illustrate the impedance analysis according to the present invention, a brief explanation of general battery characteristics and impedance analysis using EIS analysis may be useful. For most batteries, electrode and electrolyte processes dominate the changes of electrical impedance that are determined by the present invention. Important characteristics of electrochemical processes involving the battery electrodes and electrolyte can be represented in the general electrical model of FIG. 7. The circuit model represents dominant portions of the battery impedance model where:

Re—electrolyte resistance;
Cdl—double layer capacitance;
Rct—charge-transfer resistance; and
Wi—Warburg impedance.

Each portion of the model represents a physical or electrochemical process that defines the electrochemical impedance spectrum for the battery. For example, the electrolyte resistance represents the electrical impedance of the electrolyte solution. The double layer capacitance represents the interface between the electrolyte and the electrode and is formed as ions from the solution adhere to the electrode surface. This double layer capacitance depends on many variables including electrode potential, temperature, ionic concentrations, types of ions, oxide layers, electrode roughness, etc. In parallel with the double layer capacitance is the charge-transfer resistance. The charge-transfer resistance occurs as a result of the metal molecules of the electrode dissolving into the electrolyte solution because of electrons entering the metal and causing metal ions to diffuse into the electrolyte. The result of the reaction is a transfer of charge. A diffusion process is characterized by the Warburg impedance. The diffusion process is dependent on the frequency of the stimulus and the resultant Warburg impedance is unlike most typical electrical elements in that it causes a decrease in impedance at higher frequencies and a phase shift of about 45 degrees. All of these representations of battery impedance are typically present in battery cells, and they provide the focal point for impedance studies.

These significant parameters of the equivalent circuit can be derived by examination of complex impedance Nyquist curves. Nyquist curves plot the locus of impedance on the complex plane as the frequency goes from zero to infinity. Nyquist representation of battery impedance is the preferred format used by electrochemical researchers in EIS analysis.

FIG. 8 is a Nyquist plot of the ideal battery model of FIG. 7. For FIG. 8, the linear portion of the curve extending toward the upper right corresponds to the diffusion process defined by the Warburg impedance, and the semicircle portion corresponds to a kinetic process governed by the other electrochemical processes. The combination of the two processes yields an idealized look at the impedance of the battery that can help determine electrode deterioration and a subsequent prediction of how much longer the electrode can perform well. The chemical performance of the electrode typically determines the electrical performance of the battery, and examining changes in the charge-transfer resistance can monitor the electrode chemical performance. The charge-transfer resistance can be approximated through continuation of the trend of the semicircle down to the real axis.

Figure 9:
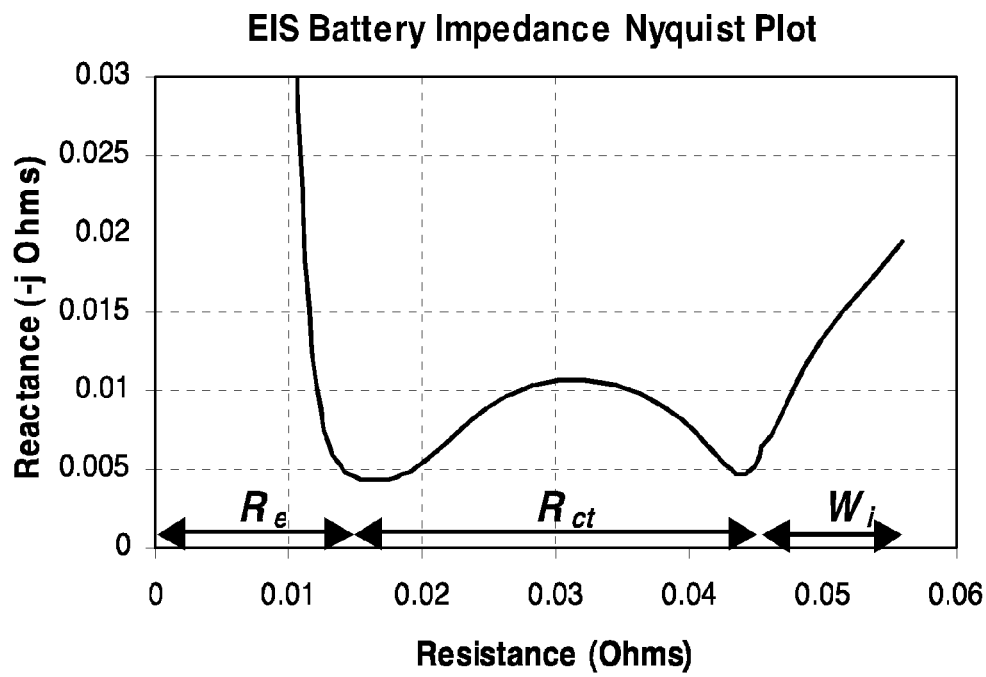
FIG. 9 is a Nyquist plot of an actual battery impedance using an electrochemical impedance spectroscopy (EIS) method of characterization.

FIG. 9 is a Nyquist plot of an actual battery impedance using an EIS method of characterization. A look at this typical EIS Nyquist curve for a typical cell shows the electrolyte (Re), charge-transfer (Rct), and Warburg (Wi) impedance regions.

Figure 10:
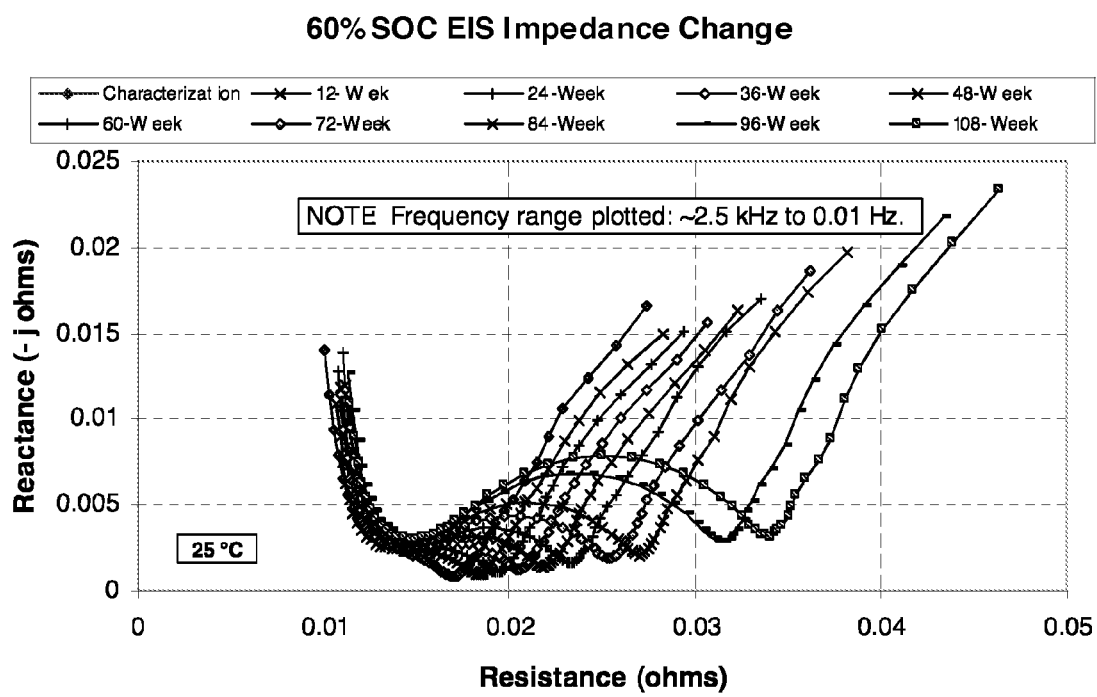
FIG. 10 is a Nyquist plot of an actual battery impedance using an electrochemical impedance spectroscopy (EIS) method of characterization at a variety of different times in an aging cycle.

Resistance changes, as mentioned previously, are mainly dependent on cell age, cell temperature, and battery state of charge. EIS data analysis has illustrated this overall resistance change related to cell aging. In addition, calendar- or cycle-life testing may be performed on a single cell where the cell is repeatedly charged and discharged. After a certain amount of the accelerated life cycling, the cell may be analyzed again. Since the cell had been aged through cycling or shelf-life, the impedance of the cell will likely change. FIG. 10 illustrates the impedance change with a plurality of Nyquist curves obtained through EIS measurements at the same SOC and temperature conditions at a variety of different times for a cell cycle-life aged at an elevated temperature.

The overall impedance is determinant upon temperature and SOC as well as cell aging. In general, the temperature affects all of the model elements while SOC may affect only the charge-transfer resistance and double layer capacitance. When the temperature and SOC are held constant, the changes in impedance from cell aging become clear. The corners of the semicircle portion of the plot grow apart from each other with the change in time. Note—the growth rate of the charge transfer resistance is not always linear, but chemistry dependent.

The present invention may be referred to as an Impedance Noise Identification (INI) system. To properly generate complex impedance data with the INI system, one should consider the test setup and connections of the INI system to other elements of the energy-output device system. Thus, in one test setup, data was collected for both a battery and a high accuracy current shunt with a resistance of 1 milliohm (not shown). In other words, a shunt replaced the battery serving as the load seen by the current generator and a data set was produced using the same test parameters. By testing a known constant impedance device, system inaccuracies and test lead impedance may be revealed that may be eliminated from the battery test. In this test setup, the separate battery and shunt data sets were subtracted from one another to eliminate inaccuracies due to the offset and phase shift caused by impedance within the current driver system and test lead set up. Of course, other more complex compensation mechanisms, which may be frequency dependent, are contemplated within the scope of the present invention. In addition, this compensation mechanism may assist in making EIS and INI comparisons because EIS measurements automatically subtract any test lead resistance. Of course, those of ordinary skill in the art will recognize that the test setup described herein illustrates preliminary data collected on a battery and is not meant to demonstrate the full capability of the present invention with respect to batteries or other energy-output devices.

Figure 11:
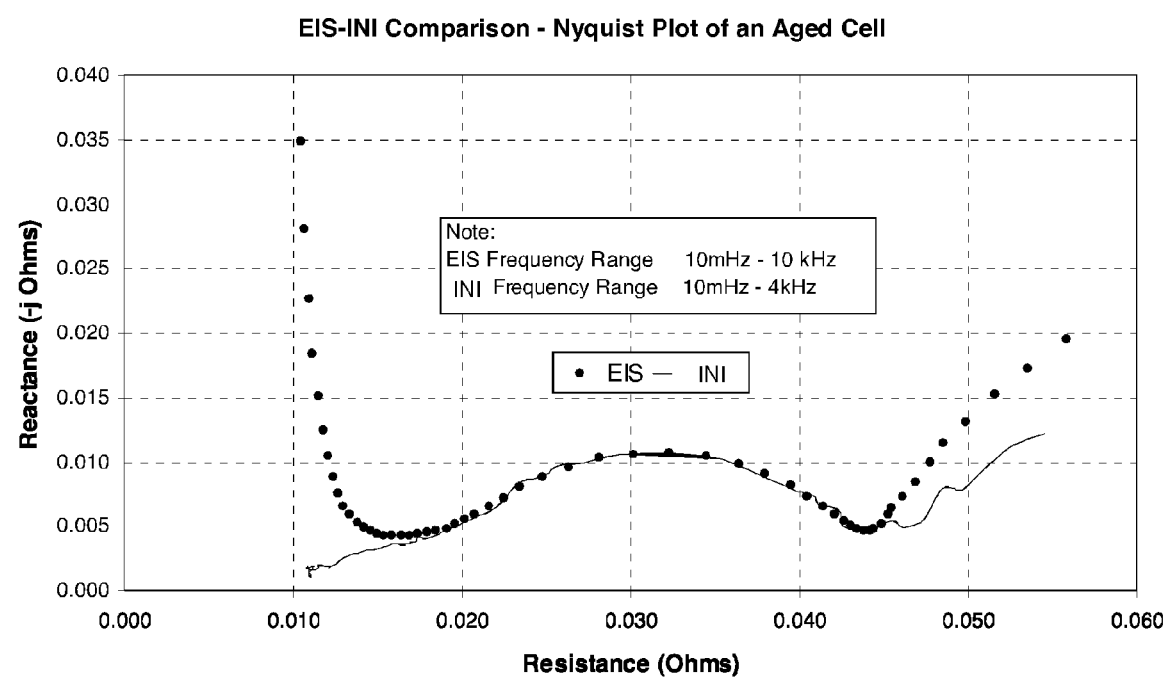
FIG. 11 is a Nyquist plot comparing an EIS characterization of a battery and a an Impedance Noise Identification (INI) characterization of the battery.
Figure 12:
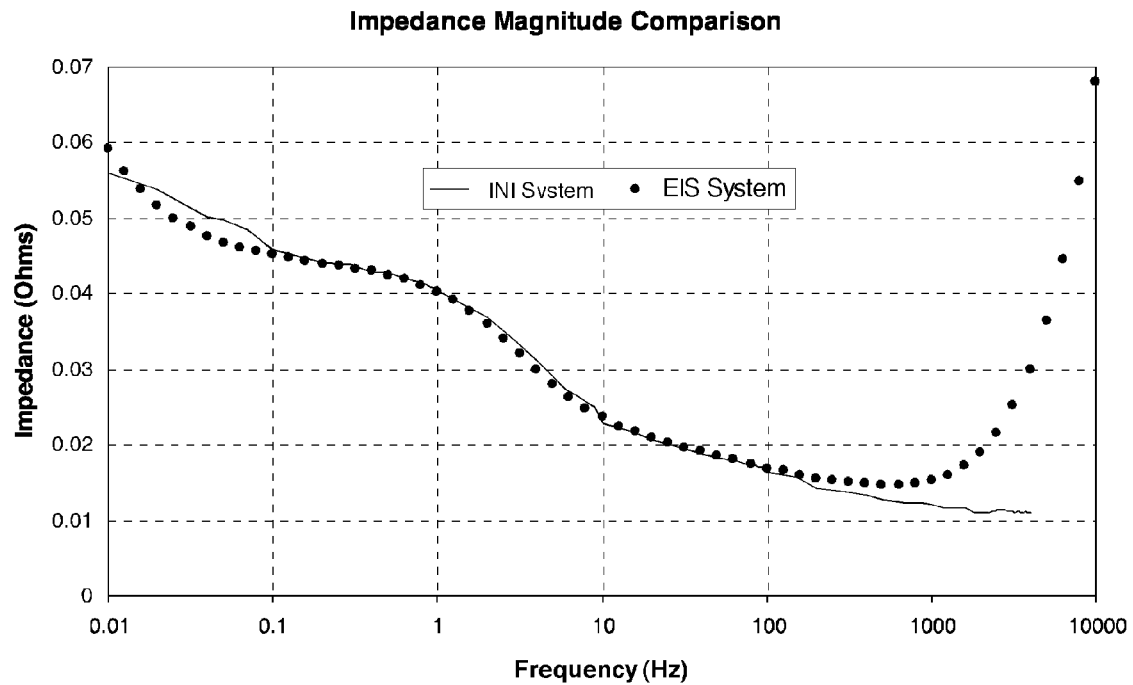
FIG. 12 is a Bode amplitude plot comparing an EIS characterization of a battery and a INI characterization of the battery.
Figure 13:
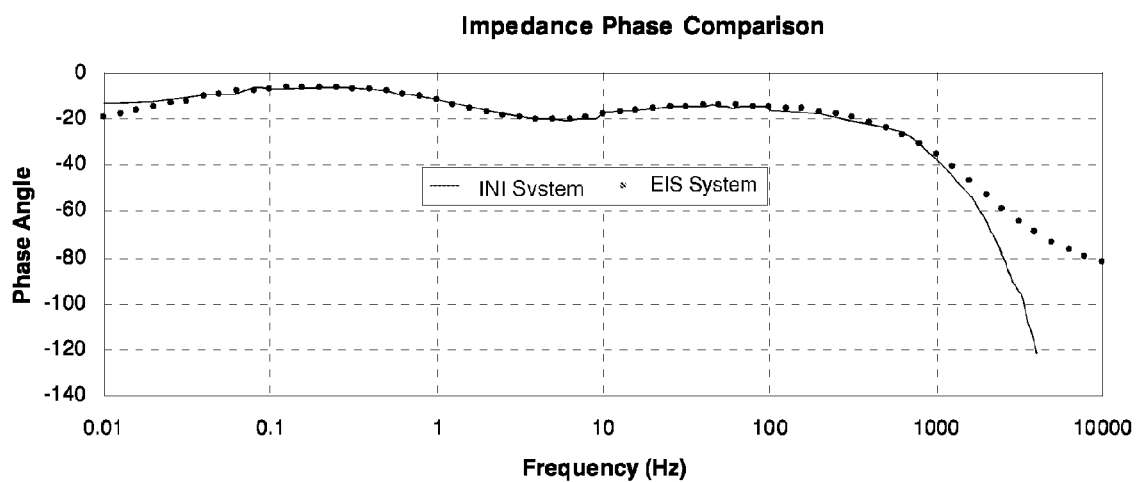
FIG. 13 is a Bode phase plot comparing an EIS characterization of a battery and an INI characterization of the battery.

FIGS. 11-13 show EIS analysis and INI analysis impedance spectra comparisons for an aged Lithium-Ion cell at 25° C. and 60% SOC. FIG. 11 is a Nyquist plot comparing an EIS characterization of a battery and an INI characterization of the battery. Although the INI system does not perfectly match the EIS system for all regions of the impedance spectrum, it does match for the previously mentioned area of interest pertaining to charge-transfer resistance. Areas where there may be some diversion include frequencies higher than the charge-transfer region that define the electrolyte resistance region and areas that are very low frequency that correspond to Warburg impedances. However, high frequency/electrolyte region measurements taken by EIS may be inaccurate due to a capacitive tail in the EIS measurements. As a result, the INI system may match the real impedance of the electrolyte region better than EIS analysis.

FIG. 12 is a Bode amplitude plot comparing an EIS characterization of a battery and an INI characterization of the battery and FIG. 13 is a Bode phase plot comparing an EIS characterization of a battery and an INI characterization of the battery. Examining the Bode impedance magnitude and phase plots give an alternate view of the complex impedance response of the battery to the random noise signal. In addition, the Bode amplitude and phase plots may offer greater insight into the nature of the variation between the INI analysis and the EIS analysis that were seen in the Nyquist plot. While Bode plots may not be the classical way of visualizing battery impedance data, the same information is plotted in a view more easily correlated to system frequency. The impedance magnitude of FIG. 12 shows where much of the differences between the two systems originate at the low-frequency Warburg impedance and high-frequency electrolyte impedance regions.

Difference in the Warburg impedance region (below 0.1 Hz) may occur mostly due to a lack of adequate averaging and noise generation. At frequencies as low as where the Warburg impedance occurs data acquisition may take tens of minutes to take one correlation sample and the averaging needs several hundred averages to get good resolution. This timing corresponds to total acquisition times of days rather than the goal of near real-time.

As was mentioned earlier, differences in magnitude at higher frequencies (above 100 Hz) may occur primarily due to instrumentation differences between the INI and EIS systems. Differences between the two systems are apparent because both systems contained long wires that connect to the battery that added inductance and resistance to the measurements. The EIS system subtracts out only the lead resistance portion while the INI system subtracts out both the resistance and inductance. The result in FIGS. 11-13 is a difference between the two systems at high frequencies. An obvious EIS system capacitive tail can be seen in FIG. 12 at high frequencies. Inherent limitations in the EIS equipment at high frequencies for low impedance cells may be the cause of the high frequency tail. Thus, the EIS high frequency tail may be an artifact of the measurement process and not real, in which case the INI results may be a more accurate representation in the electrolyte region.

Impedance greatly affects how well an energy-output device may store and transfers energy. If the impedance is correctly monitored, it is possible to calculate the present electrical status and properly give a prognosis of the efficiency of energy-output device operations. The INI system can be a tool for monitoring the energy-output device impedance and this information may be used for an algorithm in an overall fuel-gauging device for energy-output devices. Also, as was mentioned in the introduction, SOC algorithms and measurement techniques are well known, but methods to determining life, or state of health (SOH), of an energy-output device are less common. SOH is very dependent on cell impedance, in particular charge-transfer resistance. If the SOC and temperature are known or closely approximated, it may be possible to employ simple modeling to determine the energy-output device SOH with a fairly simple field instrument. This combination of SOC and SOH predictions may help the progress of fuel-gauging reliability and accuracy for energy-output devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. An apparatus for characterizing an energy-output device, comprising:
   a random noise generator configured for generating a random noise signal;
   a current generator configured for generating a random noise stimulus that is correlated to the random noise signal and configured for operable coupling to an energy-output device terminal;

a current measurement device operably coupled to the random noise stimulus and configured for measuring the random noise stimulus to determine a measured noise stimulus;

a bias reducer operably coupled an average voltage signal and configured for operable coupling to the energy-output device terminal, the bias reducer configured for generating a bias-reduced response by substantially removing the average voltage signal offset from a voltage of the energy-output device terminal; and an analyzer operably coupled to the measured noise stimulus and the bias-reduced response, the analyzer configured for correlating the measured noise stimulus and the bias-reduced response to determine an impedance of the energy-output device.

2. The apparatus of claim 1, wherein the random noise generator comprises:

a digital signal generator configured for generating a substantially random digital signal; and a bandpass filter configured for filtering the substantially random digital signal to generate the random noise signal.

3. The apparatus of claim 2, wherein the bandpass filter is selected from the group consisting of a digital filter, an analog filter, and a combination thereof.

4. The apparatus of claim 1, wherein the bias reducer comprises a differential amplifier configured to generate the bias-reduced response by comparing the average voltage signal to the voltage of the energy-output device terminal.

5. The apparatus of claim 1, wherein the current measurement device comprises a resistor configured for operable coupling between the random noise stimulus and the energy-output device terminal, wherein the measured noise stimulus is measured as a voltage drop across the resistor.

6. The apparatus of claim 1, further comprising a voltage measurement device operably coupled to the random noise stimulus and the analyzer, the voltage measurement device configured for measuring the voltage of the energy-output device terminal; and wherein the analyzer includes a bias generator configured to generate the average voltage signal as an average of periodic samples of the voltage of the energy-output device terminal.

7. The apparatus of claim 1, further comprising an amplifier module, the amplifier module comprising:

a first amplifier operably coupled between the current measurement device and the analyzer and configured for amplifying the measured noise stimulus prior to use by the analyzer; and a second amplifier operably coupled between the bias reducer and the analyzer and configured for amplifying the bias-reduced response prior to use by the analyzer.

8. The apparatus of claim 1, further comprising a filter module, the filter module comprising:

a first filter operably coupled between the current measurement device and the analyzer and configured for filtering the measured noise stimulus prior to use by the analyzer; and a second filter operably coupled between the bias reducer and the analyzer and configured for filtering the bias-reduced response prior to use by the analyzer.

9. The apparatus of claim 1, wherein the analyzer is configured for:

periodically sampling the random noise stimulus to generate a time-varying current stimulus;

periodically sampling a voltage response of the energy-output device to the random noise stimulus to generate a time-varying voltage response;

autocorrelating the time-varying current stimulus to generate an autocorrelated stimulus;

autocorrelating the time-varying voltage response to generate an autocorrelated response;

cross-correlating the time-varying current stimulus and the time-varying voltage response to generate a cross-correlated response; and combining the autocorrelated stimulus, the autocorrelated response, and the cross-correlated response to determine at least one of an impedance amplitude, an impedance phase, and a complex impedance.

10. The apparatus of claim 1, further comprising a computing system wherein the random noise generator, the analyzer, and a bias generator, are included in the computing system.

11. The apparatus of claim 10, wherein the analyzer includes computer instructions, which when executed by the computing system, perform the process of:

periodically sampling the random noise stimulus to generate a time-varying current stimulus;

periodically sampling a voltage response of the energy-output device to the random noise stimulus to generate a time-varying voltage response;

autocorrelating the time-varying current stimulus to generate an autocorrelated stimulus;

autocorrelating the time-varying voltage response to generate an autocorrelated response;

cross-correlating the time-varying current stimulus and the time-varying voltage response to generate a cross-correlated response; and combining the autocorrelated stimulus, the autocorrelated response, and the cross-correlated response to determine at least one of an impedance amplitude, an impedance phase, and a complex impedance.

12. The apparatus of claim 11, further comprising a display, and wherein the analyzer includes additional computer instructions, which when executed by the computing system, perform the process of displaying, on the display, at least one characteristic of interest of the energy-output device.

13. The apparatus of claim 12, wherein the at least one characteristic of interest includes a visual presentation selected from the group consisting of a plot of the time-varying current stimulus, a plot of the time-varying voltage response, a plot of the average voltage signal, a plot of the bias-reduced response, a frequency plot of the impedance amplitude, a frequency plot of the impedance phase, a Nyquist plot of the complex impedance, and combinations thereof.

14. A method of determining an impedance of an energy-output device, comprising:

generating a random noise signal;

generating a random noise stimulus as a current source correlated to the random noise signal;

applying the random noise stimulus to an energy-output device terminal of the energy-output device;

measuring the random noise stimulus as a measured noise stimulus;

generating a bias-reduced response by comparing a voltage at the energy-output device terminal to an average voltage signal to substantially remove the average voltage signal offset from a voltage of the energy-output device terminal; and correlating the measured noise stimulus and the bias-reduced response to determine the impedance of the energy-output device.

15. The method of claim 14, wherein generating the random noise signal comprises:
generating a substantially random digital signal; and
filtering the substantially random digital signal with a bandpass filter to generate the random noise signal.

16. The method of claim 15, wherein the filtering comprises a process selected from the group consisting of digital filtering, analog filtering, and a combination thereof.

17. The method of claim 14, wherein measuring the random noise stimulus comprises measuring a voltage drop across a resistor configured for operable coupling between the random noise stimulus and the energy-output device terminal.

18. The method of claim 14, further comprising:
measuring the voltage of the energy-output device terminal; and
generating the average voltage signal as an average of periodic samples of the voltage of the energy-output device terminal.

19. The method of claim 14, further comprising:
amplifying the measured noise stimulus prior to correlating the measured noise stimulus and the bias-reduced response; and
amplifying the bias-reduced response prior to correlating the measured noise stimulus and the bias-reduced response.

20. The method of claim 14, further comprising:
filtering the measured noise stimulus prior to correlating the measured noise stimulus and the bias-reduced response; and
filtering the bias-reduced response prior to correlating the measured noise stimulus and the bias-reduced response.

21. The method of claim 14, further comprising:
periodically sampling the random noise stimulus to generate a time-varying current stimulus;
periodically sampling a voltage response of the energy-output device to the random noise stimulus to generate a time-varying voltage response;
autocorrelating the time-varying current stimulus to generate an autocorrelated stimulus;
autocorrelating the time-varying voltage response to generate an autocorrelated response;
cross-correlating the time-varying current stimulus and the time-varying voltage response to generate a cross-correlated response; and
combining the autocorrelated stimulus, the autocorrelated response, and the cross-correlated response to determine at least one of an impedance amplitude, an impedance phase, and a complex impedance.

22. The method of claim 21, further comprising displaying, on a display, at least one characteristic of interest of the energy-output device.

23. The method of claim 22, wherein the at least one characteristic of interest includes a visual presentation selected from the group consisting of a plot of the time-varying current stimulus, a plot of the time-varying voltage response, a plot of the average voltage signal, a plot of the bias-reduced response, a frequency plot of the impedance amplitude, a frequency plot of the impedance phase, a Nyquist plot of the complex impedance, and combinations thereof.

24. A method of determining an impedance of an energy-output device using a random noise stimulus applied to the energy-output device, the method comprising:
periodically sampling the random noise stimulus to generate a time-varying current stimulus;
periodically sampling a voltage response of the energy-output device to the random noise stimulus to generate a time-varying voltage response;
autocorrelating the time-varying current stimulus to generate an autocorrelated stimulus;
autocorrelating the time-varying voltage response to generate an autocorrelated response;
cross-correlating the time-varying current stimulus and the time-varying voltage response to generate a cross-correlated response; and
combining the autocorrelated stimulus, the autocorrelated response, and the cross-correlated response to determine at least one of an impedance amplitude, an impedance phase, and a complex impedance.

25. The method of claim 24, further comprising:
generating a substantially random digital signal; and
filtering the substantially random digital signal with a bandpass filter to generate the random noise stimulus.

26. The method of claim 25, wherein the filtering comprises a process selected from the group consisting of digital filtering, analog filtering, and a combination thereof.

27. The method of claim 24, further comprising:
amplifying the random noise stimulus prior to periodically sampling; and
amplifying the voltage response prior to periodically sampling.

28. The method of claim 24, further comprising:
filtering the random noise stimulus prior to periodically sampling; and
filtering the voltage response prior to periodically sampling.

29. The method of claim 24, further comprising displaying, on a display, at least one characteristic of interest of the energy-output device.

30. The method of claim 29, wherein the at least one characteristic of interest includes a visual presentation selected from the group consisting of a plot of the time-varying current stimulus, a plot of the time-varying voltage response, a plot of the average voltage signal, a plot of the bias-reduced response, a frequency plot of the impedance amplitude, a frequency plot of the impedance phase, a Nyquist plot of the complex impedance, and combinations thereof.

* * * * *

UNITED STATES PATENT AND TRADEMARK OFFICE
CERTIFICATE OF CORRECTION

PATENT NO. : 7,675,293 B2
APPLICATION NO. : 11/381689
DATED : March 9, 2010
INVENTOR(S) : Jon P. Christophersen et al.

It is certified that error appears in the above-identified patent and that said Letters Patent is hereby corrected as shown below:

In the specification:

| | | |
|---|---|---|
| COLUMN 4, | LINE 5, | change "of representative" to --of a representative-- |
| COLUMN 6, | LINE 37, | change "defines shows that" to --shows that-- |
| COLUMN 6, | LINE 41, | change "$R_{yy}(\tau)=\Im^{-1}[S_{yy}(f)]=\int_{-\infty}^{\infty}S_{yy}(f)e^{j2\pi f\tau}df$" to --$R_{yy}(\tau)=\Im^{-1}[S_{yy}(f)]=\int_{-\infty}^{\infty}S_{yy}(f)e^{j2\pi f\tau}df$ -- |
| COLUMN 6, | LINE 53, | change "$R_{yy}(n)=\Im^{-1}[S_{yy}(k)]=\frac{1}{N}\sum_{k=0}^{N-1}S_{yy}(k)e^{j(2\pi/N)kn}$" to --$R_{yy}(n)=\Im^{-1}[S_{yy}(k)]=\frac{1}{N}\sum_{k=0}^{N-1}S_{yy}(k)e^{j(2\pi/N)kn}$ -- |
| COLUMN 8, | LINE 14, | change "bias reduced response" to --bias-reduced response 135-- |
| COLUMN 10, | LINE 52, | change "feedback resistor" to --feedback resistor R5-- |
| COLUMN 11, | LINE 55, | change "a data" to --as data-- |
| COLUMN 13, | LINE 66, | change "give an" to --gives an-- |
| COLUMN 14, | LINE 37, | change "transfers" to --transfer-- |

In the claims:
CLAIM 1, COLUMN 15, LINE 7, change "coupled an" to --coupled to an--

Signed and Sealed this
Sixteenth Day of February, 2016

Michelle K. Lee
*Director of the United States Patent and Trademark Office*